(12) United States Patent
Sporer et al.

(10) Patent No.: US 8,270,172 B2
(45) Date of Patent: Sep. 18, 2012

(54) WEDGE LOCK FOR USE WITH A SINGLE BOARD COMPUTER, A SINGLE BOARD COMPUTER, AND METHOD OF ASSEMBLING A COMPUTER SYSTEM

(75) Inventors: Bernd Sporer, Bavaria (DE); Robert Ireland, Northants (GB)

(73) Assignee: GE Intelligent Platforms Embedded Systems, Inc., Charlottesville, VA (US)

( * ) Notice: Subject to any disclaimer, the term of this patent is extended or adjusted under 35 U.S.C. 154(b) by 265 days.

(21) Appl. No.: 12/766,608

(22) Filed: Apr. 23, 2010

(65) Prior Publication Data
US 2011/0261537 A1 Oct. 27, 2011

(51) Int. Cl.
*H05K 7/20* (2006.01)
(52) U.S. Cl. ............ 361/719; 29/829; 361/704; 361/707
(58) Field of Classification Search .......................... None
See application file for complete search history.

(56) References Cited

U.S. PATENT DOCUMENTS

| | | | |
|---|---|---|---|
| 3,904,933 A | 9/1975 | Davis | |
| 4,879,634 A | 11/1989 | Storrow et al. | |
| 5,010,444 A | 4/1991 | Storrow et al. | |
| 5,859,764 A * | 1/1999 | Davis et al. | 361/704 |
| 5,887,435 A * | 3/1999 | Morton | 62/3.6 |
| 6,212,075 B1 * | 4/2001 | Habing et al. | 361/719 |
| 6,239,972 B1 * | 5/2001 | Tehan et al. | 361/704 |
| 6,246,582 B1 * | 6/2001 | Habing et al. | 361/704 |
| 6,678,159 B1 | 1/2004 | Barcley | |
| 6,765,798 B1 * | 7/2004 | Ratliff et al. | 361/704 |
| 6,873,528 B2 * | 3/2005 | Hulan et al. | 361/719 |
| 7,031,167 B1 * | 4/2006 | Zagoory et al. | 361/759 |
| 7,349,221 B2 * | 3/2008 | Yurko | 361/719 |
| 2003/0223197 A1 | 12/2003 | Hulan et al. | |
| 2004/0070944 A1 | 4/2004 | Wells et al. | |

OTHER PUBLICATIONS

Search Report and Written Opinion from corresponding PCT Application No. PCT/US2011/033438 dated Jul. 15, 2011.

* cited by examiner

*Primary Examiner* — Gregory Thompson
(74) *Attorney, Agent, or Firm* — GE Global Patent Operation; Catherine J. Toppin

(57) ABSTRACT

A wedge lock for use with a single board computer includes a cooling plate positioned with respect to a printed circuit board (PCB), a clamp device configured to secure the single board computer in an operating environment, and a heat conductance plate positioned along a top surface of the cooling plate and a top surface of the clamp device to facilitate conduction cooling of the PCB.

19 Claims, 5 Drawing Sheets

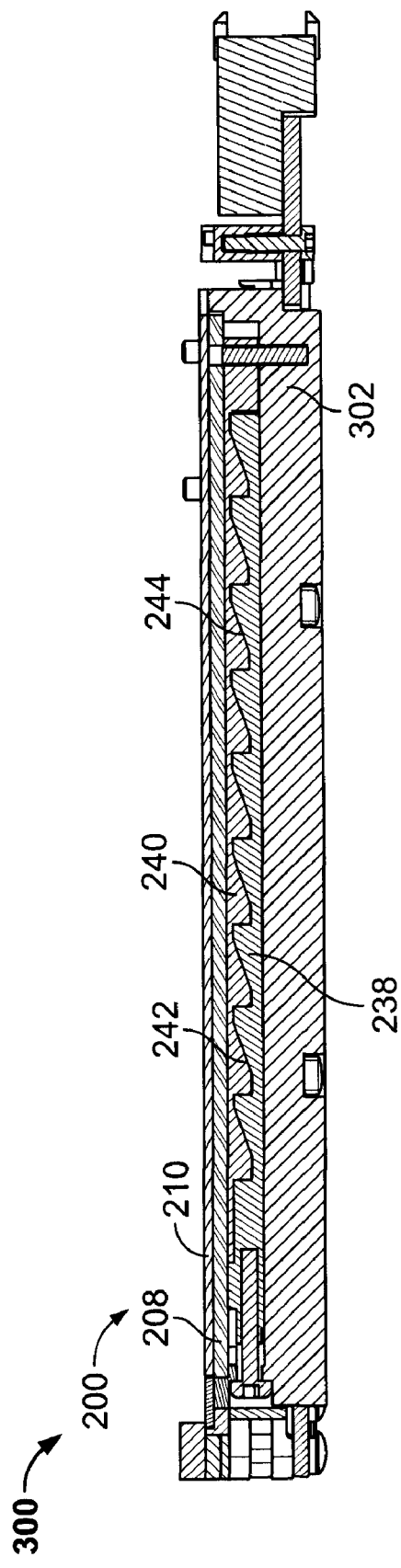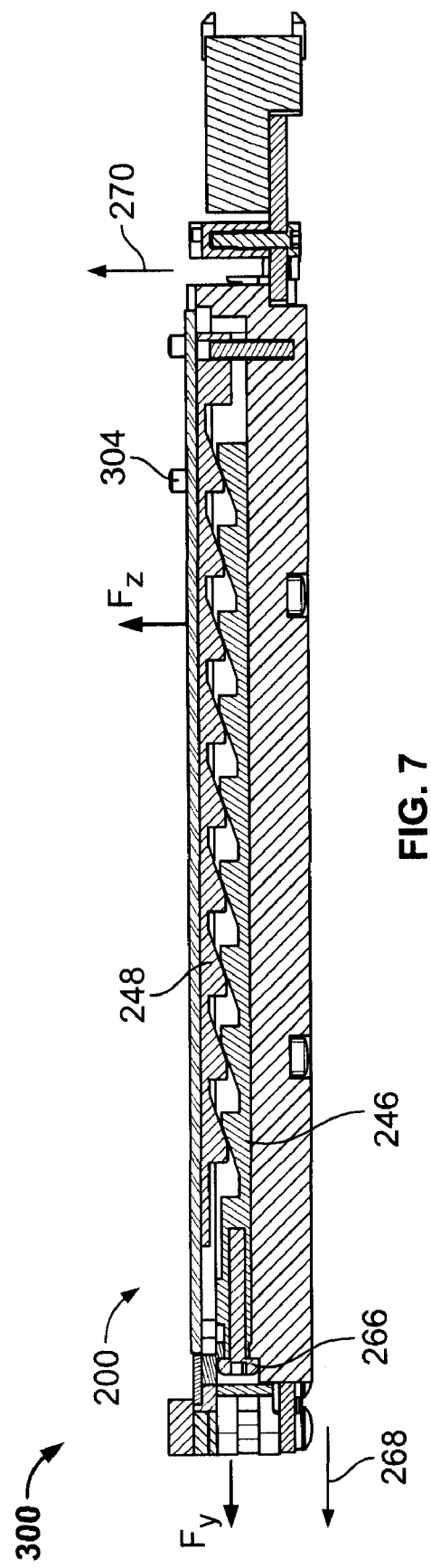

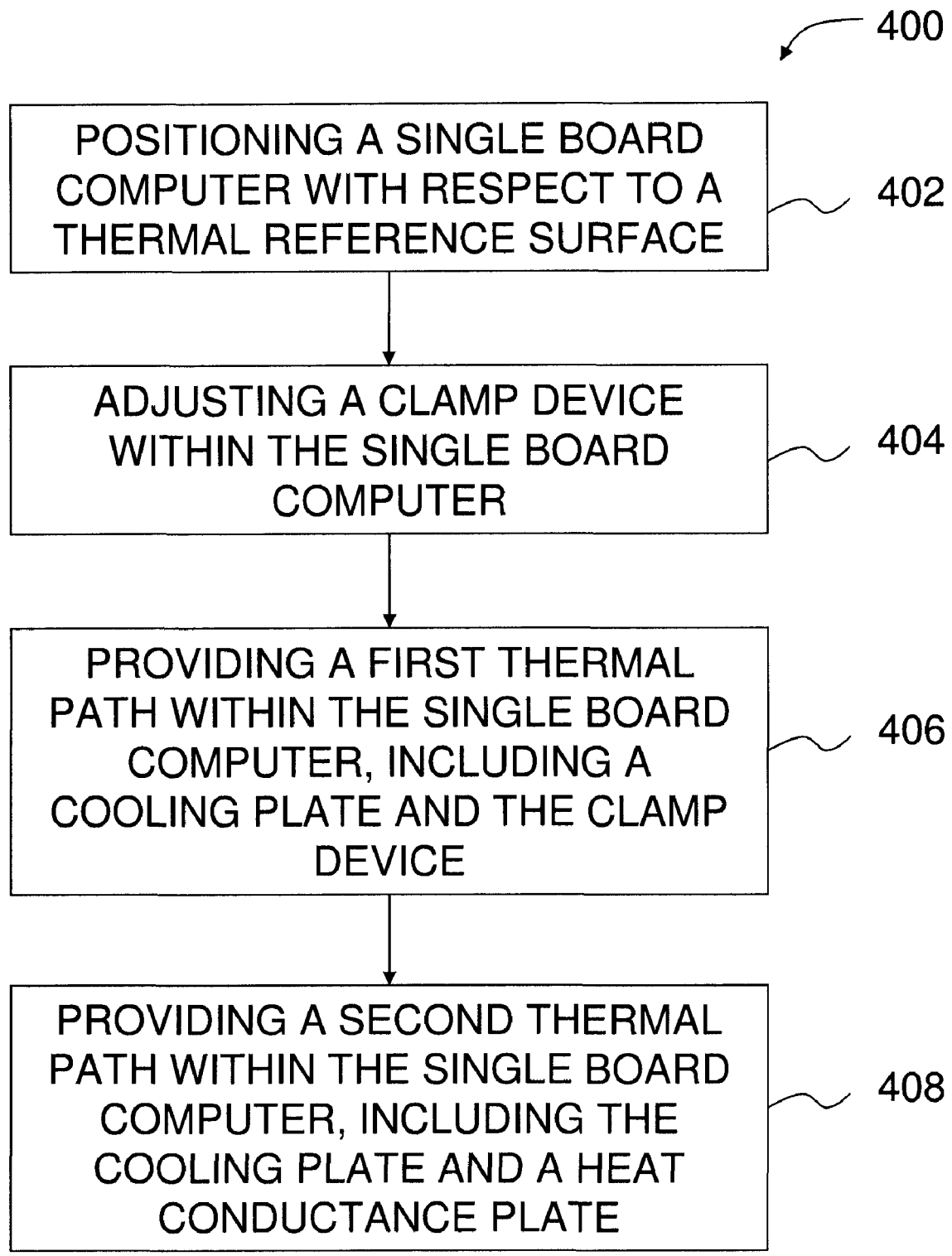

WEDGE LOCK FOR USE WITH A SINGLE BOARD COMPUTER, A SINGLE BOARD COMPUTER, AND METHOD OF ASSEMBLING A COMPUTER SYSTEM

BACKGROUND OF THE INVENTION

The subject matter disclosed herein relates generally to conductive cooling of a single board computer and, more particularly, to apparatus and methods for securing a single board computer and providing a heat path for use in conductive cooling.

As electrical assemblies, such as computers, become more densely populated with heat-generating components, such as processors, transistors, and/or diodes, component overheating becomes more likely. This increased likelihood of overheating contributes to reducing the lifespan of such assemblies and/or becomes a limiting factor in reliability and size of such assemblies.

Rack-mounted circuit boards, such as those that may be used in known electrical assemblies, may generally be classified as either a conduction cooled circuit board or a convection cooled circuit board. Many known conduction cooled circuit boards include a metal heat management layer that is positioned on one surface of the circuit board and in contact with components mounted, such as soldered, on the circuit board. The heat management layer extends to the edges of the circuit board and provides conduction surfaces that are arranged to contact heat sinks. The heat management layer is mounted to the heat sinks to facilitate thermal conduction of excess heat generated by the components to the heat sinks.

Such conduction cooled circuit boards therefore offer only a single thermal path for use in dissipating heat generated by components mounted on the circuit board. For example, FIG. 1 is a schematic diagram of a known conduction cooled single board computer 100. Computer 100 includes a printed circuit board (PCB) 102 that is positioned with respect to a side bar 104 and a cooling plate 106. A wedge lock 108 secures computer 100 in an environment, such as a system or a rack that provides card edges, by inducing a force downwards onto cooling plate 106. This downward force is likewise imparted by cooling plate 106 onto PCB 102. As such, wedge lock 108 secures computer 100 against shock and vibration that may be encountered in the operating environment. Heat generated by PCB 102 is conducted by cooling plate 106 to side bar 104 and wedge lock 108. The heat is then dissipated such that approximately one third of the heat follows a thermal path through wedge lock 108, and approximately two thirds of the heat follows a thermal path through side bar 104. As such, the heat management layer of computer 100 has a lower thermal resistance to. However, as shown in FIG. 1, the length of the main thermal path limits the amount of heat that may be dissipated from computer 100. Accordingly, an apparatus and method is desirable for increasing the amount of heat that may be dissipated by a computer using conduction cooling.

BRIEF DESCRIPTION OF THE INVENTION

This Brief Description is provided to introduce a selection of concepts in a simplified form that are further described below in the Detailed Description. This Brief Description is not intended to identify key features or essential features of the claimed subject matter, nor is it intended to be used as an aid in determining the scope of the claimed subject matter.

In one aspect, a wedge lock is provided for use with a single board computer. The wedge lock includes a cooling plate positioned with respect to a printed circuit board (PCB), a clamp device configured to secure the single board computer in an operating environment, and a heat conductance plate positioned along a top surface of the cooling plate and a top surface of the clamp device to facilitate conduction cooling of the PCB.

In another aspect, a single board computer is provided. The single board computer includes a printed circuit board (PCB) and a wedge lock that is configured to secure the single board computer within an operating environment. The wedge lock includes a cooling plate positioned with respect to the PCB, a clamp device, and a heat conductance plate positioned along a top surface of the cooling plate and a top surface of the clamp device to facilitate conduction cooling of the single board computer.

In another aspect, a method of assembling a computer system that includes a single board computer is provided, wherein the single board computer includes a printed circuit board (PCB), a cooling plate, a heat conductance plate positioned with respect to the cooling plate and a holding plate, and a clamp device. The method includes positioning the single board computer with respect to a thermal reference surface of the computer system, and adjusting the clamp device in order to secure the single board computer within the computer system and to provide a plurality of thermal paths to facilitate conduction cooling of the single board computer.

BRIEF DESCRIPTION OF THE DRAWINGS

The embodiments described herein may be better understood by referring to the following description in conjunction with the accompanying drawings.

FIG. 6 is a side view of the single board computer shown in FIG. 5 when the wedge lock is in a relaxed state.

FIG. 7 is a side view of the single board computer shown in FIGS. 5 and 6 when the wedge lock is in a clamped state.

FIG. 8 is a flowchart illustrating an exemplary method of assembling the single board computer shown in FIGS. 5-7.

DETAILED DESCRIPTION OF THE INVENTION

Described in detail herein are exemplary embodiments of methods and apparatus that facilitate providing a wedge lock into a cooling plate as a means to clamp a printed circuit board (PCB) with a single board computer. Integrating the functionality of a wedge lock requires less internal space be used to clamp the PCB within the single board computer. The regained space may then be used to increase an amount of material used to conduct heat away from the PCB. Use of additional conductive material facilitates lowering an operating temperature of the PCB. Moreover, the methods and apparatus described herein facilitate providing a means for conducting heat generated by the PCB away from the PCB. Use of a thermal conductive plate that is bent by clamping the PCB in place facilitates conducting an additional amount of heat away from the PCB during operation in order to lower an operating temperature of the PCB. Lowering the operating temperature of the PCB facilitates increasing a usable lifetime of the PCB and/or requiring less maintenance to be performed on the PCB.

Figure 1:
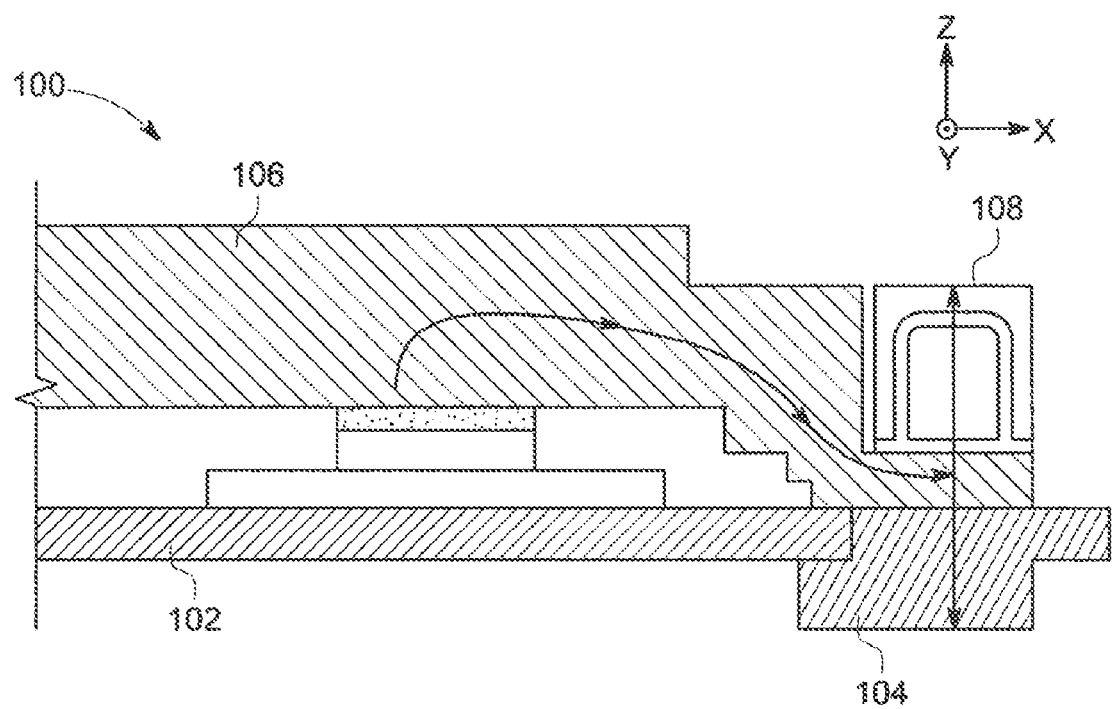
FIG. 1 is a schematic partial cross-sectional view of a known conduction cooled single board computer.
Figure 2:
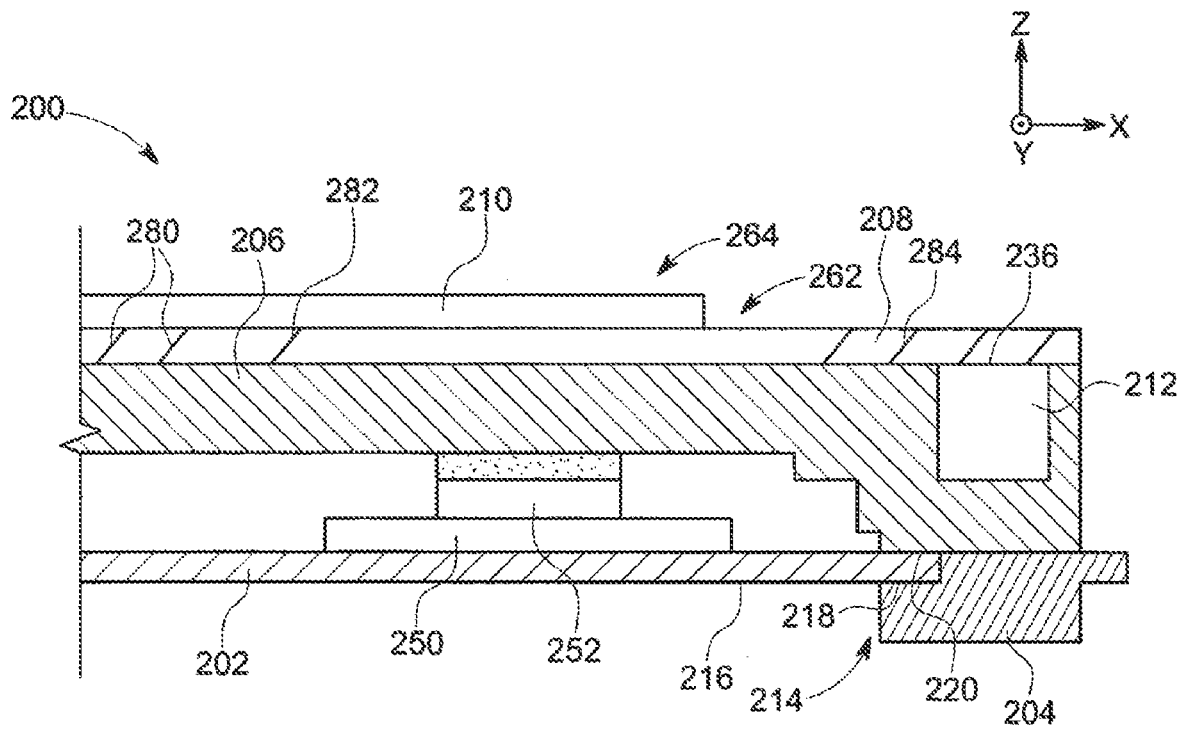
FIG. 2 is a schematic partial cross-sectional view of an exemplary wedge lock that may be used with a single board computer.
Figure 3:
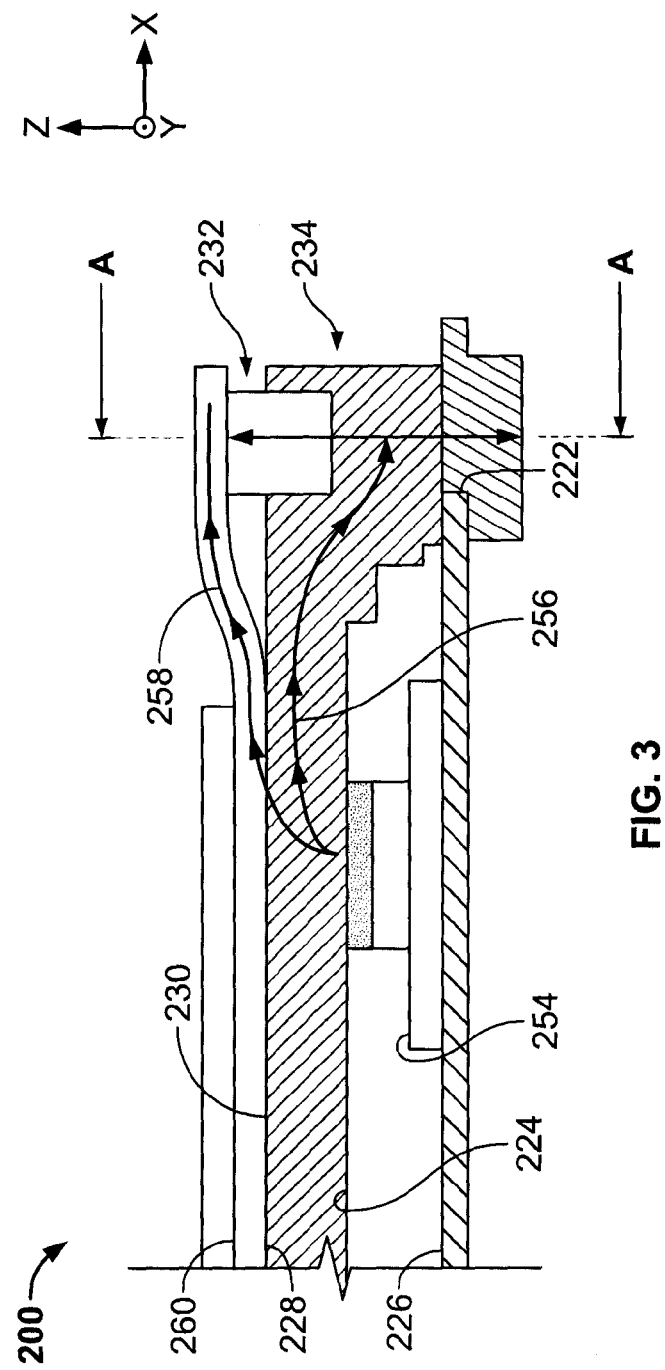
FIG. 3 is a schematic partial cross-sectional view of the wedge lock shown in FIG. 2 while in a clamped state.
Figure 4:
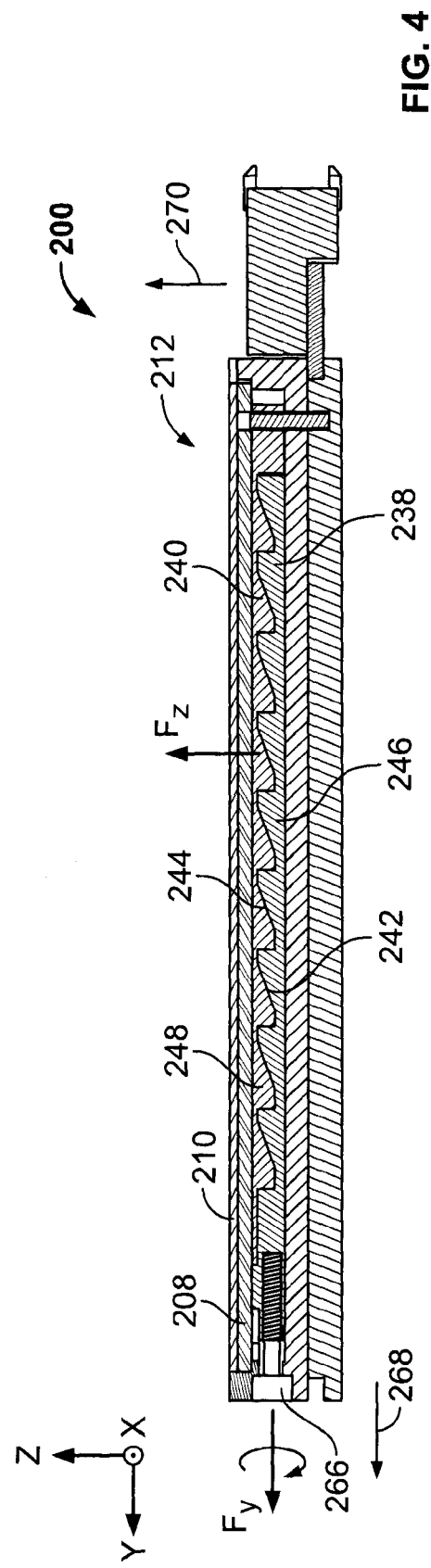
FIG. 4 is a schematic cross-sectional view of the wedge lock shown in FIGS. 2 and 3.

FIGS. 2-4 are schematic views of an exemplary integrated wedge lock 200. Specifically, FIG. 2 is a schematic partial cross-sectional view of wedge lock 200 while in a relaxed, or unclamped, state; FIG. 3 is a schematic partial cross-sectional view of wedge lock 200 while in a clamped state; and FIG. 4 is a schematic cross-sectional view of wedge lock 200 along axis A-A (shown in FIG. 3). In the exemplary embodiment, wedge lock 200 is configured to secure and/or stabilize a single board computer (not shown in FIGS. 2-4) that includes a printed circuit board (PCB) 202. Moreover, wedge lock 200 facilitates conduction cooling of PCB 202 and/or the single board computer, as described in more detail below. In some embodiments, wedge lock 200 includes a side bar 204 that enables additional conduction cooling. In other embodiments, wedge lock 200 does not include side bar 204. In the exemplary embodiment, the single board computer includes a cooling plate 206 and wedge lock 200 includes a heat conductance plate 208, a holding plate 210, and a clamp device 212. In some embodiments, side bar 204 includes an inset 214 that is sized to receive at least a portion of PCB 202. More specifically, inset 214 is sized such that a portion of a bottom surface 216 of PCB 202 is positioned along a top surface 218 of inset 214. In addition, a side surface 220 of PCB 202 is positioned along a side surface 222 of inset 214. PCB 202 is coupled to cooling plate 206 along at least a portion of a bottom surface 224 of cooling plate 206 such that bottom surface 224 is positioned along or with respect to at least a portion of a top surface 226 of PCB 202.

In the exemplary embodiment, a bottom surface 228 of heat conductance plate 208 is positioned along a top surface 230 of cooling plate 206. A channel 232 provided within an end 234 of cooling plate 206 is sized to receive clamp device 212 such that bottom surface 228 is also positioned along a top surface 236 of clamp device 212. As shown in FIG. 4, clamp device 212 includes a first sawtooth portion 238 and a cooperating second sawtooth portion 240. First sawtooth portion 238 is positioned with respect to second sawtooth portion 240 such that a top surface 242 of first sawtooth portion 238 is aligned with a bottom surface 244 of second sawtooth portion 240. More specifically, a first set of teeth 246 of first sawtooth portion 238 are interlaced with a second set of teeth 248 of second sawtooth portion 240.

As shown in FIGS. 2 and 3, and in order to conduct heat away from PCB 202, a flip chip 250 is positioned along at least a portion of top surface 226. In addition, a die 252 is positioned along at least a portion of a top surface 254 of flip chip 250. Heat generated by PCB 202 is channeled through flip chip 250 and die 252 to cooling plate 206. The heat is then channeled through a first thermal path 256 that includes cooling plate 206 and clamp device 212. In some embodiments, first thermal path 256 may also include side bar 204. Moreover, in the exemplary embodiment, the heat is also channeled through a second thermal path 258 that includes cooling plate 206 and heat conductance plate 208. As shown in FIG. 3, second thermal path 258 has a length that is shorter than a length of first thermal path 256. In one embodiment, each thermal path 256 and 258 dissipates approximately half of the heat generated by PCB 202 and/or the single board computer.

In the exemplary embodiment, wedge lock 200 secures the single board computer within an operating system, such as a rack. Moreover, wedge lock 200 facilitates greater conduction cooling of the single board computer and/or PCB 202 by creating a pressure at a thermal reference surface (not shown) in the operating system in order to provide a low thermal resistance. More specifically, holding plate 210 is positioned along at least a portion of a top surface 260 of heat conductance plate 208 such that an end 262 of heat conductance plate 208 extends beyond an end 264 of holding plate 210. As shown in FIG. 4, a screw 266 may then be rotated. The torque created by rotating screw 266 induces a force, FY, in a first direction 268 on first sawtooth portion 238. Force, FY, causes first set of teeth 246 to move in first direction 268 with respect to second set of teeth 248. The movement of first set of teeth 246 induces a force, FZ, in a second direction 270 on second sawtooth portion 240, wherein second direction 270 is perpendicular to first direction 268. Force, FZ, presses second sawtooth portion 240 against bottom surface 228 of heat conductance plate 208. Adjusting screw 266 causes end 262 of heat conductance plate 208 to bend, as shown in FIG. 3. Accordingly, in various embodiments heat conductance plate 208 is formed of a material that provides at least one of a high thermal conductivity to facilitate conducting heat away from PCB 202 and a material that provides a spring behavior, such as a copper beryllium alloy (CuBe). However, it should be understood by one of ordinary skill in the art that any suitable material may be used that provides a high thermal conductivity. A spring behavior provides a resistive force that works against force, FZ, to facilitate securing the single board computer within the operating environment and/or to facilitate providing a lower thermal resistance for use in conduction cooling of the single board computer. Moreover, in some embodiments, heat conductance plate 208 may include a plurality of shims 280, wherein at least a first portion 282 of the shims are formed of a material that provides a high thermal conductivity and at least a second portion 284 of the shims are formed of a material that provides a spring behavior.

Figure 5:
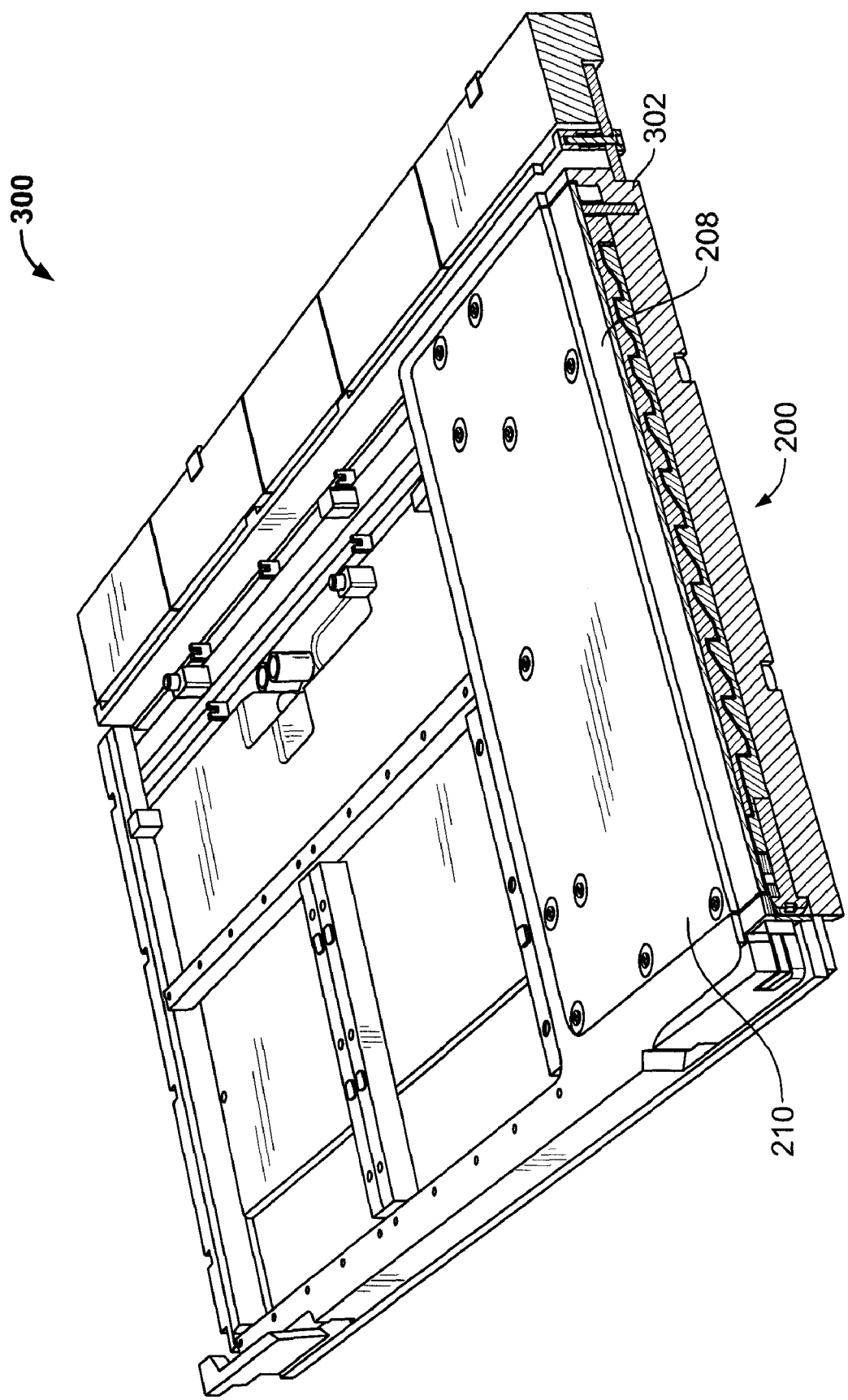
FIG. 5 is a perspective view of an exemplary single board computer that includes the wedge lock shown in FIGS. 2-4.

FIGS. 5-7 are views of an exemplary single board computer 300 that includes a wedge lock, such as wedge lock 200 (shown in FIGS. 2-4). Specifically, FIG. 5 is a perspective view of single board computer 300; FIG. 6 is a side view of single board computer 300 when wedge lock 200 is in a relaxed, or unclamped, state; and FIG. 7 is a side view of single board computer 300 when wedge lock 200 is in a clamped state. Single board computer 300 includes a PCB, such as PCB 202 (shown in FIGS. 2 and 3) and a chassis guide 302. Single board computer 300 is secured within an operating environment, such as a rack (not shown), by wedge lock 200. As shown in FIG. 6, when wedge lock 200 is in a relaxed, or unclamped, state, first sawtooth portion 238 and second sawtooth portion 240 are aligned. More specifically, top surface 242 of first sawtooth portion 238 is fully aligned with bottom surface 242 of second sawtooth portion 240. As shown in FIG. 7, when screw 266 is rotated, a force, $F_Y$, is induced on first sawtooth portion 238 such that first sawtooth portion 238 moves in first direction 268 that corresponds to force, $F_Y$. The movement of first sawtooth portion 238 causes first set of teeth 246 to likewise move relative to second set of teeth 248, thereby causing a force, $F_Z$, in second direction 270 that is perpendicular to first direction 268. As such, force, $F_Z$, is induced in second sawtooth portion 240 against heat conductance plate 208. Force, $F_Z$, is opposed by one or more fasteners 304 that couple holding plate 210 to chassis guide 302. Force, $F_Z$, facilitates securing single board computer 300 within an operating environment by protecting against excess shock and/or vibration forces. Moreover, force, $F_Z$, provides a localized pressure between single board computer 300 and a thermal reference surface (not shown) of the operating environment, which facilitates creating a low thermal resistance, thereby increasing an amount of heat that may be removed from single board computer 300. More specifically, heat is removed via conduction through first thermal path 256 and second thermal path 258 (both shown in FIGS. 2-4). First thermal path 256 includes cooling plate 206 and clamp device 212 (shown in FIGS. 2-4). In some embodiments, first thermal path 256 may also include side bar 204 (shown in FIGS. 2 and 3). Second thermal path 258 includes cooling plate 206 and heat conductance plate 208.

FIG. 8 is a flowchart 400 illustrating an exemplary method of assembling a computer system that includes a single board computer, such as single board computer 300 (shown in FIGS. 5-7). Referring to FIGS. 2-7, and in the exemplary embodiment, single board computer 300 includes PCB 202, cooling plate 206, heat conductance plate 208 positioned with respect to cooling plate 206 and holding plate 210, and clamp device 212.

In the exemplary embodiment, single board computer 300 is positioned 402 with respect to a thermal reference surface of the computer system. Then clamp device 212 is adjusted 404 in order to secure single board computer 300. More specifically, clamp device 212 is adjusted in order to secure single board computer 300 to the thermal reference surface. In one embodiment, adjusting clamp device 212 includes rotating screw 266 such that movement of first sawtooth portion 238 in first direction 268 imparts a force, $F_Z$, on second sawtooth portion 240 in second direction 270 perpendicular to first direction 268. Force, $F_Z$, secures single board computer 300 within the computer system to provide protection against, for example, shock and vibration forces. Moreover, adjusting clamp 212 in order to impart force, $F_Z$, on second sawtooth portion 240 provides 406 first thermal path 256 including cooling plate 206 and clamp device 212. Further, adjusting clamp 212 in order to impart force, $F_Z$, on second sawtooth portion 240 provides 408 second thermal path 258 including cooling plate 206 and heat conductance plate 208. As such, providing first and second thermal paths 256 and 258 facilitates conduction cooling of single board computer 300. More specifically, the pressure created between single board computer 300 and the thermal reference surface by adjusting clamp 212 facilitates a lower thermal resistance, thereby enabling additional conduction cooling of single board computer 300.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A wedge lock for use with a single board computer, said wedge lock comprising:
    a cooling plate positioned with respect to a printed circuit board (PCB);
    a clamp device configured to secure the single board computer in an operating environment;
    a heat conductance plate positioned along a top surface of said cooling plate and a top surface of said clamp device to facilitate conduction cooling of the PCB;
    wherein the heat conductance plate comprises a plurality of shims, and wherein at least a first portion of the shims are formed of a first material and at least a second portion of the shims are formed of a second material.

2. A wedge lock in accordance with claim 1, wherein said heat conductance plate comprises a material that provides a high thermal conductivity.

3. A wedge lock in accordance with claim 1, wherein said wedge lock provides a first thermal path that enables heat produced by the PCB to be removed, the first thermal path including said cooling plate and said clamp device.

4. A wedge lock in accordance with claim 3, wherein said wedge lock provides a second thermal path that enables heat produced by the PCB to be removed, the second thermal path including said cooling plate and said heat conductance plate.

5. A wedge lock in accordance with claim 4, wherein the second thermal path has a length that is shorter than a length of the first thermal path.

6. A wedge lock in accordance with claim 1, wherein said clamp device comprises a first sawtooth portion and a second sawtooth portion positioned with respect to said first sawtooth portion.

7. A wedge lock in accordance with claim 6, wherein said first sawtooth portion is configured to move in a first direction in order to induce a force on said second sawtooth portion in a second direction perpendicular to the first direction.

8. A wedge lock in accordance with claim 7, wherein the force induced on said second sawtooth portion in the second direction is induced on said heat conductance plate to secure the single board computer within the operating environment.

9. A single board computer comprising:
    a printed circuit board (PCB); and
    a wedge lock configured to secure said single board computer within an operating environment, said wedge lock comprising:
        a cooling plate positioned with respect to said PCB;
        a clamp device; and
        a heat conductance plate positioned along a top surface of said cooling plate and a top surface of said clamp device to facilitate conduction cooling of said single board computer;
        wherein the heat conductance plate comprises a plurality of shims, and wherein at least a first portion of the shims are formed of a first material and at least a second portion of the shims are formed of a second material.

10. A single board computer in accordance with claim 9, wherein said wedge lock provides a first thermal path that enables heat produced by said PCB to escape said single board computer via conduction, the first thermal path including said cooling plate and said clamp device.

11. A single board computer in accordance with claim 10, wherein said wedge lock provides a second thermal path that enables heat produced by said PCB to escape said single board computer via conduction, the second thermal path including said cooling plate and said heat conductance plate.

12. A single board computer in accordance with claim 11, wherein the second thermal path has a length that is shorter than a length of the first thermal path.

13. A single board computer in accordance with claim 9, wherein said clamp device comprises a first sawtooth portion and a second sawtooth portion positioned with respect to said first sawtooth portion.

14. A single board computer in accordance with claim 13, wherein said first sawtooth portion is configured to move in a first direction to induce a force on said second sawtooth portion in a second direction perpendicular to the first direction.

15. A single board computer in accordance with claim 14, wherein the force induced on said second sawtooth portion in the second direction is induced on said heat conductance plate to secure said single board computer within the operating environment.

16. A method of assembling a computer system that includes a single board computer, the single board computer including a printed circuit board (PCB), a cooling plate, a heat conductance plate positioned with respect to the cooling plate and a holding plate, and a clamp device, said method comprising:

positioning the single board computer with respect to a thermal reference surface of the computer system; and adjusting the clamp device in order to secure the single board computer within the computer system and to provide a plurality of thermal paths to facilitate conduction cooling of the single board computer;

wherein the heat conductance plate comprises a plurality of shims, and wherein at least a first portion of the shims are formed of a first material and at least a second portion of the shims are formed of a second material.

17. A method in accordance with claim 16, wherein adjusting the clamp device comprises rotating a screw in a first direction such that a first sawtooth portion of the clamp device imparts a force on a second sawtooth portion of the clamp device in a second direction perpendicular to the first direction.

18. A method in accordance with claim 16, wherein positioning the single board computer with respect to a thermal reference surface facilitates providing a first thermal path that includes the cooling plate and the clamp device.

19. A method in accordance with claim 18, wherein positioning the single board computer with respect to a thermal reference surface further facilitates providing a second thermal path that includes the cooling plate and the heat conductance plate, the second thermal path having a length that is shorter than a length of the first thermal path.

* * * * *